(12) United States Patent
Yu

(10) Patent No.: US 6,709,935 B1
(45) Date of Patent: Mar. 23, 2004

(54) METHOD OF LOCALLY FORMING A SILICON/GERANIUM CHANNEL LAYER

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/817,580

(22) Filed: Mar. 26, 2001

(51) Int. Cl.[7] .......................................... H01L 21/336
(52) U.S. Cl. ...................... 438/289; 438/692; 438/290; 438/183
(58) Field of Search ................................ 438/270, 700, 438/692, 289, 290, 194, 183, 185

(56) References Cited

U.S. PATENT DOCUMENTS

| | | |
|---|---|---|
| 4,046,618 A | 9/1977 | Chaudhari et al. |
| 4,272,880 A | 6/1981 | Pashley |
| 4,381,201 A | 4/1983 | Sakurai |
| 4,710,478 A | 12/1987 | Yoder et al. |
| 4,849,033 A | 7/1989 | Vander Sande et al. |
| 4,975,387 A | 12/1990 | Prokes et al. |
| 4,994,866 A | 2/1991 | Awano |
| 4,996,574 A | 2/1991 | Shirasaki |
| 5,008,211 A | 4/1991 | Yamazaki |
| 5,019,882 A | 5/1991 | Solomon et al. |
| 5,036,374 A | 7/1991 | Shimbo |
| 5,041,884 A | 8/1991 | Kumamoto et al. |
| 5,128,732 A | 7/1992 | Sugahara et al. |
| 5,155,571 A | 10/1992 | Wang et al. |
| 5,321,286 A | 6/1994 | Koyama et al. |
| 5,346,834 A | 9/1994 | Hisamoto et al. |
| 5,414,288 A | 5/1995 | Fitch et al. |
| 5,420,048 A | 5/1995 | Kondo |
| 5,451,798 A | 9/1995 | Tsuda et al. |
| 5,461,250 A | 10/1995 | Burghartz et al. |
| 5,482,877 A | 1/1996 | Rhee |
| 5,497,019 A | 3/1996 | Mayer et al. |
| 5,554,870 A | 9/1996 | Fitch et al. |
| 5,581,101 A | 12/1996 | Ning et al. |
| 5,591,653 A | 1/1997 | Sameshima et al. |
| 5,612,552 A | 3/1997 | Owens |
| 5,675,185 A | 10/1997 | Chen et al. |
| 5,683,934 A | 11/1997 | Candelaria |
| 5,689,136 A | 11/1997 | Usami et al. |
| 5,753,541 A | 5/1998 | Shimizu |
| 5,766,989 A | 6/1998 | Maegawa et al. |

(List continued on next page.)

FOREIGN PATENT DOCUMENTS

| | | |
|---|---|---|
| EP | 0 334 682 A2 | 3/1989 |
| JP | 61-180466 | 8/1986 |
| JP | 3-288471 | 12/1991 |
| JP | 5-335482 | 12/1993 |

OTHER PUBLICATIONS

"Smart–Cut: The Basic Fabrication Process for UNIBOND Soi Wafers" Herve, et al., Mar. 3, 1997.
"Sub–100nm Gate Length Metal Gate NMOS Transistors Fabricated by a Replacement Gate Process" By Chatterjee, Dec. 7–10, 1997 IEEE.
U.S. patent application Ser. No. 09/599,141 entitled "A process for Manufacturing Transistors having Silicon/Germanium Channel Regions" by Yu on Jun. 22, 2000.
U.S. patent application Ser. No. 09/633,208 entitled "Multiple Active Layer Structure and a Method of Making Such a Structure" by Yu on Aug. 7, 2000.

*Primary Examiner*—Caridad Everhart
(74) *Attorney, Agent, or Firm*—Foley & Lardner

(57) ABSTRACT

A method of forming a specialized channel region removes a sacrificial gate material and provides a semiconductor implant though the recess associated with the remove sacrificial gate material. The process can be utilized to form a silicon germanium layer in the channel region having a sharp profile in the vertical direction. Further, the silicon germanium layer can be ultra-thin. The silicon germanium channel region has increased charge mobility with respect to conventional channel regions.

20 Claims, 3 Drawing Sheets

U.S. PATENT DOCUMENTS

| | | |
|---|---|---|
| 5,821,149 A | 10/1998 | Schuppen et al. |
| 5,856,225 A * | 1/1999 | Lee et al. .................. 438/291 |
| 5,910,015 A | 6/1999 | Sameshima et al. |
| 5,936,280 A | 8/1999 | Liu |
| 5,981,345 A | 11/1999 | Ryum et al. |
| 5,985,703 A | 11/1999 | Banerjee |
| 6,031,269 A | 2/2000 | Liu |
| 6,130,367 A * | 10/2000 | Kossmann et al. |
| 6,172,381 B1 | 1/2001 | Gardner et al. |
| 6,190,975 B1 | 2/2001 | Kubo et al. |
| 6,232,622 B1 | 5/2001 | Hamada |
| 6,310,367 B1 * | 10/2001 | Yagishita et al. ........... 257/190 |
| 6,319,799 B1 | 11/2001 | Ouyang et al. |
| 6,350,311 B1 | 2/2002 | Chin et al. |

\* cited by examiner

METHOD OF LOCALLY FORMING A SILICON/GERANIUM CHANNEL LAYER

CROSS REFERENCE TO RELATED APPLICATIONS

The present application is related to U.S. application Ser. No. 09/633,208, entitled "Multiple Active Layer Structure and a Method of Making Such a Structure", now issued U.S. Pat. No. 6,429,484 and U.S. application Ser. No. 09/599,141, entitled "A Process for Manufacturing Transistors Having Silicon/Germanium Channel Regions", both filed on Jun. 20, 2000, by Yu entitled and assigned to the Assignee of the present application.

FIELD OF THE INVENTION

The present invention is related to integrated circuit (IC) devices. More particularly, the present invention relates to a method of locally forming a specialized channel region for a transistor.

BACKGROUND OF THE INVENTION

Transistors are generally formed on the top surface of a semiconductor substrate. Typically, the semiconductor substrate is divided into a number of active and isolation regions through an isolation process, such as field oxidation or shallow trench isolation (STI). A thin oxide is grown on an upper surface of the semiconductor substrate in the active regions. The thin oxide serves as the gate oxide for subsequently formed transistors.

Polysilicon gate conductors are formed in the active regions above the thin oxide. The gate conductor and thin oxide form a gate structure which traverses each active region, effectively dividing the active region into two regions referred to as a source region and a drain region. After formation of the polysilicon gates, an implant is performed to introduce an impurity distribution into the source/drain regions. Generally, source/drain regions are heavily doped with n-type or p-type dopants.

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-inducted barrier-lowering. Shallow source and drain extensions and, hence, controlling short-channel effects, are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or an ion implantation process. Without the sidewall spacers, the doping process introduces dopants into a thin region just below the top surface of the substrate to form the drain and source extensions as well as to partially form the drain and source regions.

After the drain and source extensions are formed, silicon dioxide spacers, which abut lateral sides of the gate structure, are provided over the source and drain extensions. With the silicon dioxide spacers in place, the substrate is doped a second time to form deep source and drain regions. During formation of the deep source and drain regions, further doping of the source and drain extensions is inhibited due to the blocking characteristic of the silicon dioxide spacers. The deep source and drain regions are necessary to provide sufficient material to connect contacts to the source and drain regions.

As transistors become smaller, it is desirous to increase the charge carrier mobility in the channel region. Increasing charge carrier mobility increases the switching speed of the transistor. Channel regions formed from materials other than silicon have been proposed to increase charge carrier mobility. For example, conventional thin film transistors which typically utilize polysilicon channel regions have been formed on a silicon germanium (Si—Ge) epitaxial layer above a glass ($SiO_2$) substrate. The Si—Ge epitaxial layer can be formed by a technique in which a semiconductor thin film, such as, an amorphous silicon hydride (a-Si:H), an amorphous germanium hydride (a-Ge:H) or the like is melted and crystallized by the irradiation of pulse laser beams.

In a bulk type device, such as, a metal oxide semiconductor field effect transistor (MOSFET), the use of Si—Ge materials can increase charge carrier mobility, especially hole type carriers. A channel region containing germanium can have charge carrier mobility 2–5 greater than a conventional Si channel region due to reduce charge carrier scattering and due to the reduced mass of holes in the germaniumcontaining material. According to conventional Si—Ge formation techniques for bulk-type devices, a dopant implanted molecular beam epitaxy (MBE) technique forms a Si—Ge epitaxial layer. However, the MBE technique requires very complicated, very expensive equipment and is not feasible for mass production of ICs.

A silicon germanium layer can be provided in the channel region to achieve a channel region containing germanium. As transistor dimensions are minimized, the thickness of the silicon germanium layer must be very thin (e.g., less than several hundred angstroms). Further, a very sharp interface between the silicon substrate and silicon germanium layer is required. Conventional fabrication methods have not been able to feasibly produce thin silicon germanium layers having an abrupt or very sharp interface in the silicon substrate.

Thus, there is a need for an integrated circuit or electronic device that includes channel regions with higher channel mobility. Further still, there is a need for transistors with a thin and abrupt Si—Ge channel layer. Even further still, there is a need for a method of manufacturing a transistor having a thin Si—Ge channel region on a bulk-type semiconductor substrate. Yet further still, there is a need for a method of fabricating a thin silicon-germanium channel layer with a very sharp interface between it and a silicon substrate.

SUMMARY OF THE INVENTION

An exemplary embodiment relates to a method of forming a channel region for a transistor. The method includes providing a layer of material over a gate structure above a substrate, and selectively creating an aperture in the layer of material. A sacrificial gate material is exposed when the aperture is created. The method further comprises removing the sacrificial gate material to leave the recess and providing a semiconductor implant through the recess to the channel region.

Another exemplary embodiment relates to a method of forming a transistor. The method includes steps of: depositing a layer of material over a gate structure, polishing the layer of the material over the gate structure, etching a sacrificial gate material to leave a recess, and implanting germanium ions into a substrate though the recess. The gate structure includes the sacrificial gate material. The polishing step is utilized to expose the sacrificial gate material. Etching the sacrificial gate material leaves the recess through which the germanium ions form a channel region including germanium.

Another exemplary embodiment relates to a method of forming an integrated circuit. The method includes providing a transistor above a substrate. The transistor includes a sacrificial gate material between a source region and a drain region. The method also includes providing an oxide liner over the sacrificial gate material, selectively removing the oxide liner to expose the sacrificial gate material, removing the sacrificial gate material, and doping the channel region to form the silicon germanium layer in the substrate.

BRIEF DESCRIPTION OF THE DRAWINGS

Preferred exemplary embodiments are described below with reference to the accompanying drawings, wherein like reference numerals denote like elements, and.

DETAILED DESCRIPTION OF THE PREFERRED EMBODIMENTS

Figure 1:
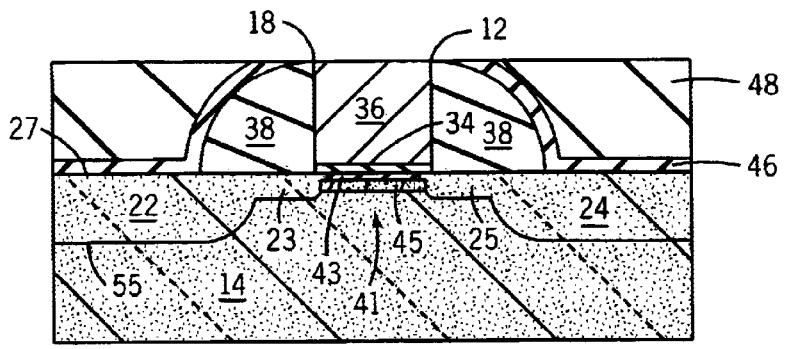
FIG. 1 is a cross-sectional view of a portion of an integrated circuit including a transistor with a specialized channel region in accordance with an exemplary embodiment of the present invention.

With reference to FIG. 1, a portion 10 of an integrated circuit (IC) includes a transistor 12 which is disposed on a semiconductor substrate 14, such as, a wafer. Semiconductor substrate 14 is preferably a bulk P-type single crystalline (001) silicon substrate. Alternatively, substrate 14 can be an N-type well in a P-type substrate, or a semiconductor-on-insulator (SOI) substrate, (preferably silicon-on-glass) or other suitable material for transistor 12.

Transistor 12 can be a P-channel or N-channel metal oxide semiconductor field effect transistor (MOSFET). Transistor 12 includes a gate structure 18, a source region 22, and a drain region 24. Regions 22 and 24 extend from a top surface 27 of portion 10 to a bottom 55 in substrate 14. Regions 22 and 24 are preferably 50 nanometers (nm)—120 nm thick from surface 27 to bottom 55 (junction depth) and include a source extension 23 and a drain extension 25. For an N-channel transistor, regions 22 and 24 are heavily doped with N-type dopants (e.g., $5 \times 10^{19}$–$1 \times 10^{20}$ dopants per cubic centimeter). For a P-channel transistor, regions 22 and 24 are heavily doped with P-type dopants (e.g., $5 \times 10^{19}$–$1 \times 10^{20}$ dopants per cubic centimeter).

Extensions 23 and 25 are preferably shallow extensions (e.g., junction depth is less than 50 nm (15–40 nm)), which are thinner than regions 22 and 24. Extensions 23 and 25 are connected to regions 22 and 24, respectively, and are disposed partially underneath gate structure 18. Extensions 23 and 25 can be ultra-shallow to help transistor 12 achieve substantial immunity to short-channel effects. Short-channel effects can degrade performance of transistor 12 as well as the manufacturability of the IC associated with transistor 12.

Regions 22 and 24 and extensions 23 and 25 have a concentration of $10^{19}$ to $10^{20}$ dopants per cubic centimeter. An appropriate dopant for a P-channel transistor is boron, boron diflouride, or iridium, and an appropriate dopant for an N-channel transistor is arsenic, phosphorous, or antimony.

Gate stack or structure 18 includes a gate dielectric layer 34 and a gate conductor 36. Dielectric layer 34 is preferably comprised of a thermally grown, 15–25 Å thick silicon dioxide material. Alternatively, deposited silicon dioxide ($SiO_2$), silicon nitride ($Si_3N_4$) material, or high K gate dielectric materials can be utilized.

Gate structure 18 can also include a pair of spacers 38. Spacers 38 can be manufactured in a conventional deposition and etch back process. Preferably, spacers 38 are manufactured from silicon dioxide and are 800–1200 Å in height (thick) and 500–1000 Å wide. Alternatively, other insulative material, such as, silicon nitride can be utilized to form spacers 38.

Gate conductor 36 is preferably doped polysilicon. Alternatively, conductor 36 can be metal, such as a refractory metal, or include germanium to adjust the work function of transistor 12. Gate structure 18 has a height or thickness of 800–1200 Å.

Gate structure 18 is disposed over a channel region 41 which is between extensions 23 and 25. Channel region 41 is specialized to have increased charge carrier mobility. Channel region 41 is preferably less than 100 percent of the depth of regions 22 and 24.

Channel region 41 has a width slightly less than the gate length (e.g., 35 nm-100 nm) and advantageously includes a semiconductor containing germanium. Region 41 can be doped with P-type or N-type dopants according to various design specifications, such as, a super-steep retrograded region.

Channel region 41 can include a thin silicon layer 43 and a thin silicon germanium layer 45. Alternatively, semiconductor material other than silicon can be utilized in layers 43 and 45. Thus, channel region 41 is comprised of a compound structure including layers 43 and 45. Layer 43 advantageously protects the integrity of dielectric layer 34 from the effects of germanium in layer 45. Thus, layer 43 can serve as a cap layer or protection layer above layer 45.

In a preferred embodiment, silicon germanium layer 45 is ultra thin (e.g., less than 300 Å thick) 200–500 Å thick, and silicon layer 43 is 50–100 Å thick. Therefore, silicon germanium layer 45 is located from 50–100 Å below top surface 27 of portion 10. Silicon germanium layer 45 preferably has a very sharp interface between substrate 14 and silicon layer 43 (very sharp SiGe profile in the vertical direction).

Channel region 41 including layers 43 and 45 is preferably almost as deep as extensions 23 and 25. Channel region 41 is significantly shallower than the deep regions (contact locations) associated with source region 22 and drain region 24. Accordingly, sufficient depth is available for making contact to source region 22 and drain region 24 and yet a thin channel region 41 including silicon germanium layer 45 is attained. The use of layer 45 including germanium allows the mobility of carriers to be approximately 2–5 times larger than a channel region 41 comprised solely of silicon material.

The interface between silicon germanium layer 45 and substrate 14 is preferably extremely sharp in the vertical direction. An ideal design has a very clearly defined border between layer 45 and substrate 14. The mechanical stress associated with layer 45 increases mobility for channel region 41 (e.g., stress-enhanced mobility).

A liner oxide 46 is provided above top surface 27 of substrate 14 over spacers 38. Liner oxide layer 46 can be a 150–200 Å silicon dioxide layer. Alternatively, other materials can be utilized. An insulative layer 48 can be disposed over layer 46. In one embodiment, layer 48 is a 3000–5000 Å thick nitride film polished to the thickness of gate structure 18.

With reference to FIGS. 1–8, the fabrication of transistor 12, including channel region 41, is described below as follows. The advantageous process allows channel region 41 to include germanium and yet does not require MBE equipment. The process also allows deep source and drain regions 22 and 24 to be formed and yet allows channel region 41 to have an ultra-thin germanium containing layer (layer 45) with a sharp profile in the vertical direction.

Figure 2:
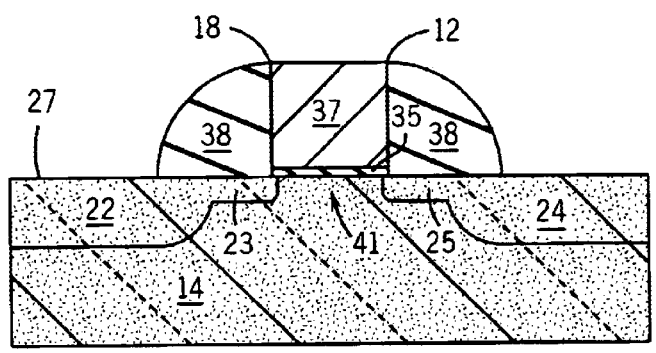
FIG. 2 is a cross-sectional view of the portion of the integrated circuit of FIG. 1, illustrating a gate structure formation step in a method utilized to form a transistor with the specialized channel region.

In FIG. 2, portion 10 includes transistor 12 substantially formed by conventional IC fabrication processes. For example, a conventional double implant process can be utilized to form source region 24 and drain region 24 including extensions 23 and 25 in substrate 14. Channel region 41 can be doped in accordance with appropriate parameters before regions 22 and 24 are formed. Substrate 14 can be doped in a variety of fashions depending upon design criteria.

Substrate 14 includes a gate stack or structure 18 on its surface 27. Gate structure 18 in FIG. 1 is substantially similar to the gate structure 18 shown in FIG. 1. However, gate structure 18 in FIGS. 1–4 includes a sacrificial gate material 37 rather than conductor 36 (FIG. 1) and a sacrificial gate oxide 35 rather than dielectric layer 34.

Sacrificial gate material 37 can be a polysilicon material. In one embodiment, sacrificial gate material 37 is a 800–1200 Å thick undoped polysilicon. Sacrificial gate oxide 35 can be a 15–30 thick silicon dioxide layer.

Sacrificial gate material 37 is deposited by chemical vapor deposition (CVD) over thermally grown oxide 35 to form a stack. The stack of material 37 and oxide 35 is lithographically patterned in a conventional process to form conductor 37 and oxide 35 for structure 18. Spacers 38 are silicon dioxide spacers formed in a conventional deposition and etch back process.

After formation of transistor 12 as shown in FIG. 2, a high temperature annealing process 1000–1100° C. is performed. The high temperature annealing process can be a rapid thermal annealing (RTA) process to activate dopants in regions 22 and 24. Various alternative conventional processes can be utilized to form the structure shown in FIG. 2.

Figure 3:
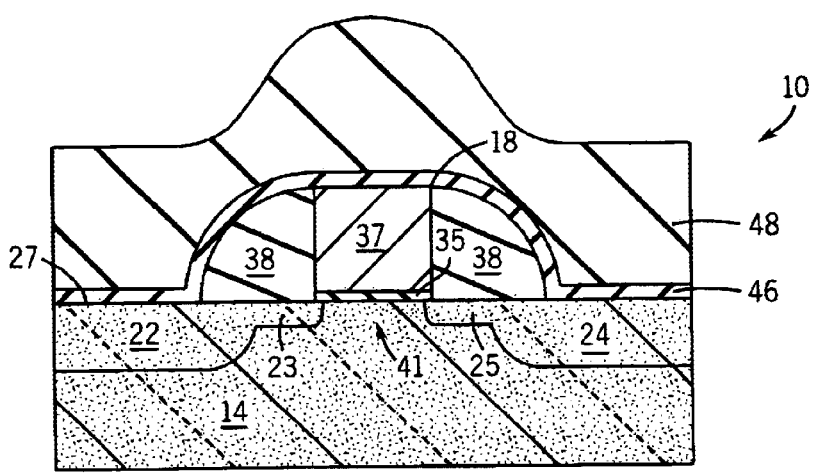
FIG. 3 is a cross-sectional view of the portion of the integrated circuit of FIG. 1, illustrating a liner oxide deposition step and nitride layer deposition step in the method utilized to form a transistor with the specialized channel region.

In FIG. 3, gate structure 18 including sacrificial gate conductor 37 is covered by an oxide liner layer 46. Layer 46 covers top surface 27 of substrate 14 above source region 22 and drain region 24. In addition, oxide liner layer 46 covers spacers 38 and sacrificial gate conductor 37.

Layer 46 can be deposited by CVD as a 150–200 Å silicon dioxide layer. After layer 46 is deposited, a film or covering layer 48 is deposited above layer 46. Layer 48 can be a 3000–5000 Å silicon nitride film deposited by CVD.

Figure 4:
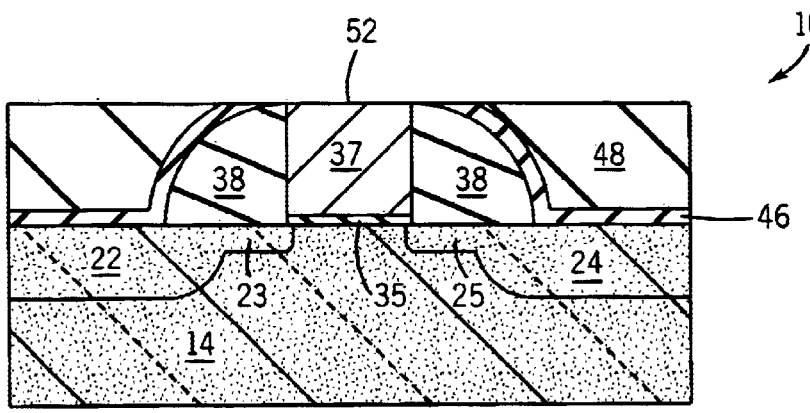
FIG. 4 is a cross-sectional view of the portion of the integrated circuit of FIG. 1, illustrating a polish step in the method utilized to form a transistor with the specialized channel region.

With reference to FIG. 4, after layer 48 is deposited, portion 10 is subjected to a polishing process. According to a preferred embodiment, a chemical-mechanical polish (CMP) step is performed to expose a top surface 52 of sacrificial gate material 37. The chemical mechanical polish removes portions of both layers 48 and 46 to expose sacrificial gate conductor 37. In one embodiment, a CMP process selective to layer 48 exposes layer 46. After layer 46 is exposed above structure 18, a CMP process selective to layer 46 and not selective to material 37 is employed. Alternatively, an etching or other removal process can be utilized to uncover sacrificial gate material 37.

Oxide liner 46 performs a function of an etch stop between material 37 and layer 48. Oxide liner 46 is used as buffer layer between deposited nitride film (layer 48) and the silicon substrate (substrate 14).

Figure 5:
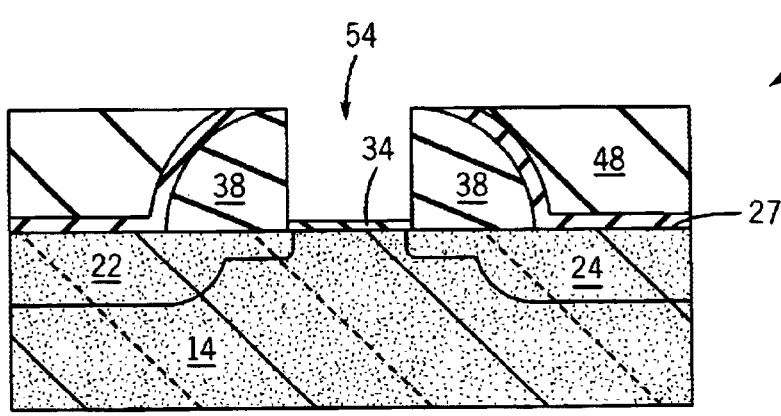
FIG. 5 is a cross-sectional view of the portion of the integrated circuit of FIG. 1, illustrating a gate conductor removal step in the method utilized to form a transistor with the specialized channel region.

In FIG. 5, after sacrificial gate material 37 is exposed, portion 10 is subjected to a removal process to form a recess 54 between spacers 38. Preferably, the removal process utilizes a wet chemical etching to remove material 37. The wet chemical etching can further remove sacrificial gate oxide 35. Alternatively, a dry etching technique can remove material 37 and oxide 35.

After removal of material 35 (FIG. 4), a gate dielectric layer 34 can be formed (a gate oxide can be reformed). Preferably, gate dielectric layer 34 is thermally grown to a thickness of 15–25 Å.

Figure 6:
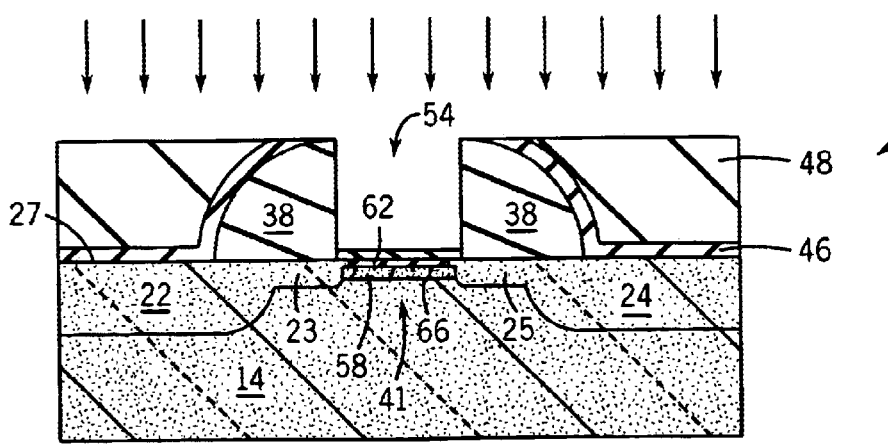
FIG. 6 is a cross-sectional view of the portion of the integrated circuit of FIG. 1, illustrating an implant step in the method utilized to form a transistor with the specialized channel region.

In FIG. 6, portion 10 is subjected to a germanium implant through recess 54. Preferably, a high dose of germanium is implanted through recess 54 (gate window) into channel region 41. The implantation process can utilize conventional implantation devices capable of accelerating germanium ions at an energy of 5–30 KeV and a dose of $1 \times 10^{16}$ dopants cm$^2$ to $1 \times 10^{17}$ dopants cm$^{-2}$. Preferably, the implant forms an amorphous region 58 Å below top surface 27 of substrate 14.

Amorphous region 58 is located between extensions 23 and 25 and includes a top surface 62 that is 50–100 Å below top surface 27 of substrate 14 and a bottom surface 66 that is 250–400 Å below top surface 27 of substrate 14. Preferably, region 58 has a concentration of (on the order of) approximately $1 \times 10^{21}$ cm$^{-3}$ germanium ions per centimeter cubed. Alternative doping and implantation processes can be utilized to form amorphous region 58 through region 54.

Figure 7:
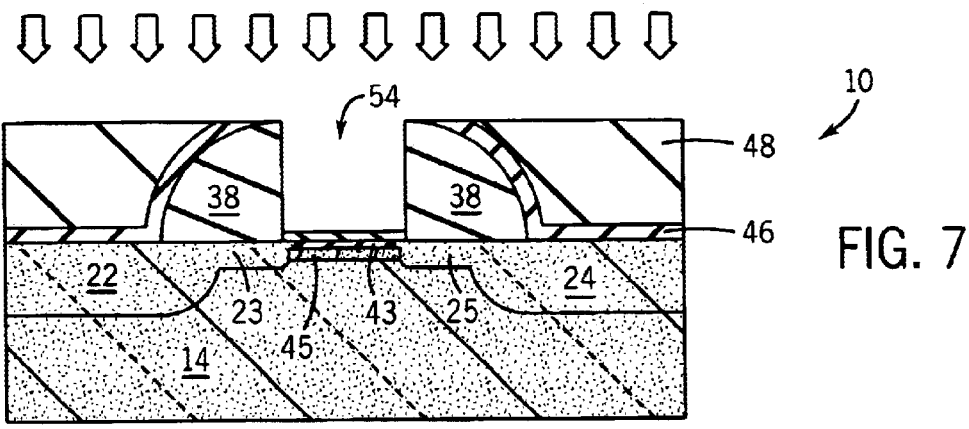
FIG. 7 is a cross-sectional view of the portion of the integrated circuit of FIG. 1, illustrating an annealing step in the method utilized to form a transistor with the specialized channel region.

With reference to FIG. 7, portion 10 is subjected to an annealing process to form silicon germanium layer 45. Preferably, the annealing process selectively provides an excimer laser beam (308 nm wavelength) through recess 54. Region 58 (FIG. 6), which is very shallow, is melted by the excimer laser beam. After the laser beam is removed, layer 54 is formed as a crystallized layer having a thickness of 150–300 Å. Preferably, the duration of the laser pulse is several nanoseconds, thereby preventing adverse affects of a high thermal budget. The silicon germanium profile for layer 45 is very sharp in the vertical direction, thereby having a minimal transition region.

In one embodiment, the annealing process can raise the temperature of region 54 to the melting temperature of region (1100° C. for amorphous silicon germanium). The melting temperature of layer 64 in the amorphous state is significantly lower than that of substrate 14 which is in a crystalline state. For example, the melting temperature of amorphous silicon germanium is 1100° C. and the melting temperature of a single crystalline silicon substrate (C-Si) is 1400° C. Preferably, the laser fluence is controlled so that region 58 is fully melted and substrate 14 is not melted. After the laser beam is removed, region 58 is recrystallized as a single crystalline material. Region 58 corresponds to silicon germanium layer 45 (channel region 41 in FIG. 1). The annealing process can be a solid phase epitaxy process.

Figure 8:
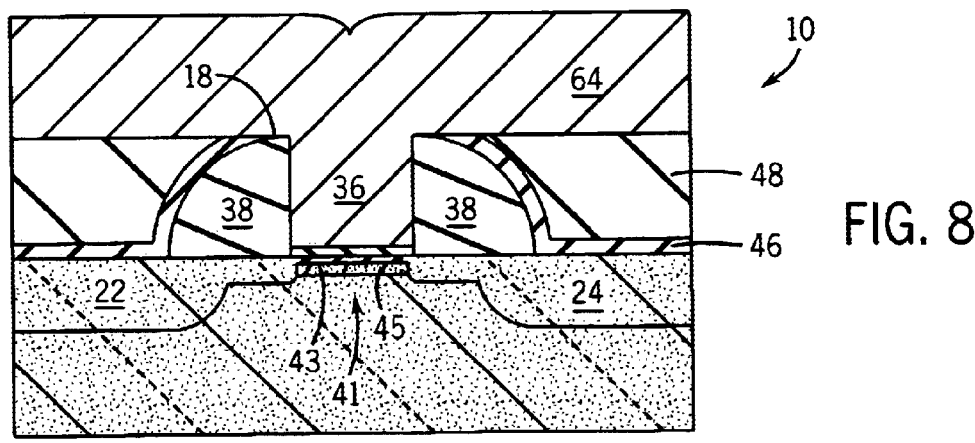
FIG. 8 is a cross-sectional view of the portion of the integrated circuit of FIG. 1, illustrating a gate conductor deposition step in the method utilized to form a transistor with the specialized channel region.

With reference to FIG. 8, after layer 45 is formed beneath layer 43, recess 54 can be filled with a gate material 64. Gate material 64 can be a polysilicon material or a metal material, or any material capable for being used as a gate conductor. Preferably, material 64 is deposited as a thick film of in situ doped polysilicon or refractory metal, such as, molybdenum (Mo), titanium (Ti), tungsten (W), aluminum (Al), etc.

Material 64 can be deposited by sputtering or CVD. After deposition of material 64, material 64 is polished by CMP to leave gate conductor 36 in recess 54, thereby completing gate structure 18. Alternative removal processes can be used to leave conductor 36 in recess 58.

With reference to FIG. 1, conventional CMOS fabrication processes can be utilized to form silicide layers, interconnects, contacts, etc. Layer 48 can be removed and replaced with tetraethylorthosilicate (TEOS) deposited silicon dioxide.

While the embodiments illustrated in the FIGURES and described above are presently preferred, it should be understood that these embodiments are offered by way of example only. Other embodiments may include, for example, different techniques for providing a gate or removing layers deposited on portion 10. The invention is not limited to a particular embodiment, but extends to various modifications, combinations, and permutations that nevertheless fall within the scope and spirit of the appended claims.

What is claimed is:

1. A method of forming a channel region for a transistor, the method comprising:
    providing a layer of material over a gate structure above a substrate, the gate structure including a sacrificial gate material;
    creating an aperture in the layer of material to expose the sacrificial gate material;
    removing the sacrificial gate material to leave a recess; and
    providing a semiconductor implant through the recess to the channel region to create mechanical stress in the channel region, thereby at least doubling charge carrier mobility in the channel region, wherein the channel region includes a silicon/germanium layer having a very sharp interface with the substrate, the silicon/germanium layer being less than 300 Å thick.

2. The method of claim 1, further comprising providing a gate in the recess.

3. The method of claim 1, further comprising providing a covering layer before the layer of material is provided.

4. The method of claim 3, wherein the covering layer comprises an oxide.

5. The method of claim 4, wherein the layer of material is a nitride.

6. The method of claim 1, wherein the semiconductor implant utilizes germanium.

7. The method of claim 1, wherein the channel region has a width slightly less than a width of the sacrificial gate material.

8. A method of forming a transistor, the method comprising steps of:
    depositing a layer of material over a gate structure including a sacrificial gate material;
    polishing the layer of material over the gate structure to expose the sacrificial gate material;
    etching the sacrificial gate material to leave a recess; and
    implanting germanium ions into a substrate through the recess to form a channel region including germanium, wherein the channel region includes a silicon germanium region less than 300 Å thick, the silicon germanium region being a single crystalline region.

9. The method of claim 8, wherein the gate structure includes a silicon dioxide gate insulator.

10. The method of claim 8, wherein the gate structure includes silicon dioxide spacers abutting lateral sides of the sacrificial gate material.

11. The method of claim 10, wherein the sacrificial gate material is polysilicon.

12. The method of claim 11, wherein the layer of material includes silicon nitride.

13. The method of claim 12, further comprising depositing a metal layer in the recess.

14. The method of claim 12, further comprising depositing an in situ doped polysilicon material into the recess.

15. A method of forming a transistor, the method comprising steps of:
    depositing a layer of material over a gate structure including a sacrificial gate material;
    polishing the layer of material over the gate structure to expose the sacrificial gate material;
    etching the sacrificial gate material to leave a recess;
    implanting germanium ions into a substrate through the recess to form a channel region including germanium; and
    annealing the substrate with a laser through the recess.

16. The method of claim 15, wherein the channel region includes a silicon germanium region less than 300 Å thick, the silicon germanium region being a single crystalline region.

17. A method of forming an integrated circuit, the method comprising:
    providing a transistor above a substrate, the transistor including a sacrificial gate material between a source region and a drain region;
    providing an oxide liner over the sacrificial gate material;
    removing the oxide liner to expose the sacrificial gate material;
    removing the sacrificial gate material;
    doping the channel region through the recess to form an ultra-thin silicon/germanium layer in the substrate; and
    annealing with an excimer laser beam after the doping.

18. The method of claim 17, further comprising providing a layer of material over the oxide liner and removing the layer of material to expose the oxide liner above the sacrificial gate material.

19. The method of claim 17, wherein the silicon/germanium layer is 150–300 Å thick.

20. The method of claim 19, wherein the oxide layer is removed by a chemical mechanical polish.

* * * * *